US006833042B2

(12) United States Patent
Yamane et al.

(10) Patent No.: US 6,833,042 B2
(45) Date of Patent: Dec. 21, 2004

(54) METHOD OF MANUFACTURING CLAD BOARD FOR FORMING CIRCUITRY, CLAD BOARD, AND CORE BOARD FOR CLAD BOARD

(75) Inventors: Shigeru Yamane, Osaka (JP); Eiji Kawamoto, Osaka (JP); Hideaki Komoda, Osaka (JP); Takeshi Suzuki, Osaka (JP); Toshihiro Nishii, Osaka (JP); Shinji Nakamura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/149,667

(22) PCT Filed: Oct. 15, 2001

(86) PCT No.: PCT/JP01/09033

§ 371 (c)(1),
(2), (4) Date: Oct. 9, 2002

(87) PCT Pub. No.: WO02/34023

PCT Pub. Date: Apr. 25, 2002

(65) Prior Publication Data

US 2003/0091787 A1 May 15, 2003

(30) Foreign Application Priority Data

Oct. 16, 2000 (JP) ........................................ 2000-314861

(51) Int. Cl.⁷ ................................................ B29C 65/00

(52) U.S. Cl. .................... 156/285; 156/247; 156/273.9; 156/272.2; 29/847; 174/259

(58) Field of Search ................................. 156/196, 242, 156/247, 250, 273.9, 285, 289, 261, 272.2; 29/847; 174/259, 265, 257

(56) References Cited

U.S. PATENT DOCUMENTS

| 4,383,363 | A | * | 5/1983 | Hayakawa et al. | ............ 29/847 |
| 5,652,042 | A | * | 7/1997 | Kawakita et al. | ............ 428/209 |
| 5,733,467 | A | * | 3/1998 | Kawakita et al. | ............. 216/18 |
| 5,914,358 | A | * | 6/1999 | Kawakita et al. | ............ 523/458 |
| 5,977,490 | A | * | 11/1999 | Kawakita et al. | ............ 174/265 |
| 6,096,411 | A | * | 8/2000 | Nakatani et al. | ............ 428/209 |

FOREIGN PATENT DOCUMENTS

| EP | 0 645 951 A1 | 3/1995 |
| EP | 0 651 602 A1 | 5/1995 |
| JP | 49-107079 | 10/1974 |

(List continued on next page.)

OTHER PUBLICATIONS

Japanese search report for PCT/JP01/09033 dated Jan. 8, 2002.
English translation of Form PCT/ISA/210.
European Search Report for EP 01 97 4853 dated Jan. 14, 2003.

*Primary Examiner*—Merrick Dixon
(74) *Attorney, Agent, or Firm*—RatnerPrestia

(57) ABSTRACT

A manufacturing method of a clad board includes: sticking a releasing film to a pre-preg sheet; forming a non-through-hole or through-hole in the pre-preg sheet including the releasing film; filling the hole with conductive paste; peeling off the film; and heating and pressing a metal foil onto the pre-preg sheet. The clad board has a smooth face formed on one face or both the faces of the pre-preg sheet, so that the conductive paste is restrained from spreading in an interface between the pre-preg sheet and the releasing film. This structure can avoid short-circuit between circuits and prevent insulating reliability from lowering. As a result, an yield rate is improved, and a reliable circuit board is obtainable.

12 Claims, 6 Drawing Sheets

FOREIGN PATENT DOCUMENTS

| | | |
|---|---|---|
| JP | 61-69409 | 4/1986 |
| JP | 01-272416 | 10/1989 |
| JP | 06-31827 | 2/1994 |
| JP | 06-268345 | 9/1994 |
| JP | 07-106760 | 4/1995 |
| JP | 07-144390 | 6/1995 |
| JP | 09-174546 | 7/1997 |
| JP | 09-321430 | 12/1997 |
| JP | 10-037054 | 2/1998 |
| JP | 2768236 | 4/1998 |
| JP | 11-172147 | 6/1999 |
| JP | 2000-013018 | 1/2000 |
| JP | 2000-234107 | 8/2000 |
| JP | 2002-094200 | 7/2002 |

* cited by examiner

METHOD OF MANUFACTURING CLAD BOARD FOR FORMING CIRCUITRY, CLAD BOARD, AND CORE BOARD FOR CLAD BOARD

This application is a U.S. National Phase Application of PCT International Application PCT/JP01/09033.

TECHNICAL FIELD

The present invention relates to a method of manufacturing a clad board for forming circuitry, the clad board, and a core board for the clad board.

BACKGROUND ART

Recently, electronic devices have been downsized, and components have been assembled at high densities into the devices. A conventional clad board for forming circuitry including electronics components mounted thereon has progressed from a single-sided board to a double-sided board, and a multi-layered board is now available. As such, a clad board to include the components at a higher density has been developed in order to accommodate more circuits therein.

Instead of plated through-holes preventing a clad board from accommodating more circuits at a higher density, conductive paste for connections through inner via-holes is proposed (e.g. in Japanese Patent Application Laid-Open No.06-268345).

In this method of manufacturing clad boards, a porous and compressive pre-impregnation sheet (hereinafter called "pre-preg sheet") including a polymer releasing film on both the faces is used. Through-holes are punched through the pre-preg sheet, and are filled with conductive paste, then the releasing film is peeled off. Metal foils are stuck to both faces of the pre-preg sheet, which is then heated and compressed, whereby both faces become electrically conductive with each other. Then the metal foils are etched for patterning, thereby forming circuits.

This conventional method of manufacturing a clad board will be described hereinafter with reference to accompanying drawings. FIG. 5A through FIG. 5F are sectional views illustrating the conventional method of manufacturing the clad boards.

First, as shown in FIG. 5A, a porous pre-preg sheet 1 of 500 mm square and "t1" mm thickness is prepared. This sheet includes releasing film 2 made of polymer film of approx. 20 μm thickness, e.g. polyethylene terephtalate (PET), on both the faces, and a releasing layer made of silicon-based material is formed on one face of film 2. As porous pre-preg sheet 1, composite material is employed. The composite material is made of non-woven fabric of aromatic polyamide fiber, in which thermosetting epoxy resin is impregnated.

Next, as shown in FIG. 5B, through-holes 3 are formed at predetermined positions with energy beam such as laser. Pre-preg sheet 1 is placed on a table of a printing machine (not shown) for printing conductive paste 4 onto releasing film 2. Through-holes 3 are filled with paste 4 as shown in FIG. 5C. At this time, upper releasing film 2 prevents a print mask and pre-preg sheet 1 from being contaminated.

As shown in FIG. 5D, films 2 on both the faces of pre-preg sheet 1 are peeled off, then metal foil 5 such as copper foil is stuck to each face of sheet 1 as shown in FIG. 5E. Then sheet 1 is heated and pressed, and metal foil 5 adheres to sheet 1 as shown in FIG. 5F. Simultaneously, sheet 1 is compressed to the thickness of "t2" mm (t1>t2), and the metal foils on both the faces are electrically connected with conductive paste 4. Epoxy resin, one of the components of sheet 1, and conductive paste 4 are cured at this time. Then metal foil 5 on each face is selectively etched for forming circuit patterns (not shown), whereby a double-sided circuit-patterned board is obtained.

However, the method discussed above has the following problems.

Releasing film 2 is stuck to both the faces of pre-preg sheet 1 by the laminating method, as disclosed in Japanese Patent No.2768236. Then, as shown in FIG. 6A and FIG. 6B, at some points in the surface of sheet 1, non-woven fabric 6 is exposed. Even if fabric 6 is not exposed, if large peaks and valleys (roughness) are formed on a face of a surface resin layer, sheet 1 does not securely adhere to film 2. Yet, fine gaps 10 are formed on the interface between sheet 1 and film 2, as shown in FIG. 7A and FIG. 7B.

When through-holes 3 of such pre-preg sheet 1 are filled with conductive paste 4, particularly when through-hole 3 is provided at gap 10, conductive paste 4 also penetrates into gap 10 as shown in FIG. 7C. As a result, a pattern touches an adjacent pattern while the circuits are formed, which produces a short-circuit or lowers insulating reliability between wiring. These problems increases at a higher density of wiring patterns.

DISCLOSURE OF THE INVENTION

The present invention aims to prevent a short circuit due to a gap produced on an interface between a conventional pre-preg sheet and a releasing film. The present invention also aims to prevent insulating reliability from lowering, and increase a yield rate of circuit boards. The present invention aims to provide a clad board for forming circuitry, a method of manufacturing the clad boards, and a core board of the clad board.

The method of manufacturing the clad board of the present invention includes: sticking a releasing film to a pre-preg sheet; forming a non-through hole or a through-hole in the pre-preg sheet including the releasing film; filling the hole with conductive paste; peeling off the releasing film; and attaching metal foil on the pre-preg sheet by applying heat and pressure thereto. A smooth face is formed on the pre-preg sheet to be used for the clad board.

DETAILED DESCRIPTION OF EXEMPLARY EMBODIMENTS (Exemplary Embodiment 1)

A first exemplary embodiment of the present invention will be described with reference to FIG. 1A to FIG. 4F. FIG. 4A to FIG. 4F are sectional views illustrating a method of manufacturing a clad board for forming circuitry in accordance with the first exemplary embodiment. The manufacturing method includes a releasing-film-sticking step, a hole-forming step, conductive-paste-filling step, peeling-off step, heat-and-pressure-applying step, and circuit-forming step.

Figure 1A:
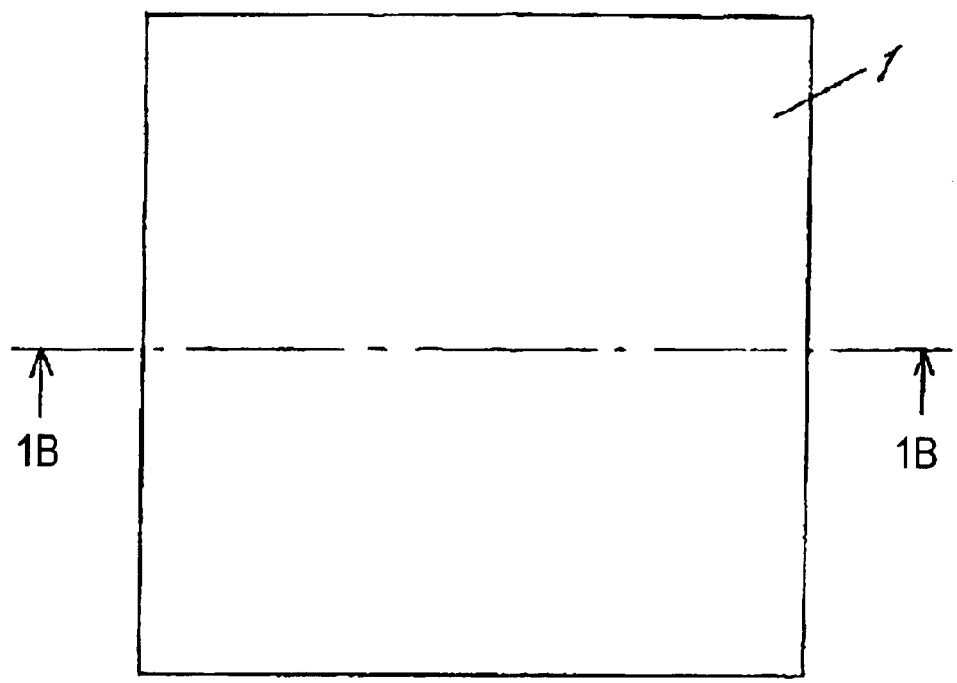
FIG. 1A is a plan view showing a structure of a pre-preg sheet in accordance with a first exemplary embodiment of the present invention.
Figure 1B:
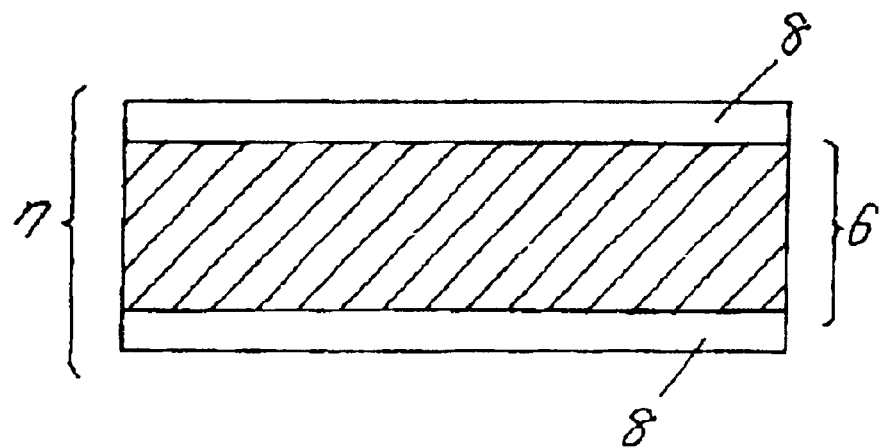
FIG. 1B is a sectional view of the pre-preg sheet taken along line 1B—1B in FIG. 1A.

As shown in FIG. 1A and FIG. 1B, pre-preg sheet 1 is a composite material including impregnated resin 7 (e.g. thermosetting resin such as epoxy resin) and non-woven fabric 6 of fiber sheet such as aromatic polyamide fiber (aramid fiber). Impregnated resin 7 is not completely cured but includes a semi-cured portion, i.e., impregnated resin 7 is in B-stage.

Figure 4A:
FIG. 4A to FIG. 4F are sectional views illustrating a method of manufacturing clad boards in accordance with the first embodiment.

Releasing film 2 shown in FIG. 4A is formed of polymer film such as polyethylene terephthalate (PET) of 20 μm thickness, having a silicon-based releasing layer of approx. 100 Å film thickness. On each face of pre-preg sheet 1, this releasing layer is placed. Sheet 1 passes between two heating rolls (not shown) to be heated and pressed to have film 2 is stuck to each face of sheet 1 as shown in FIG. 4A.

Figure 4B:
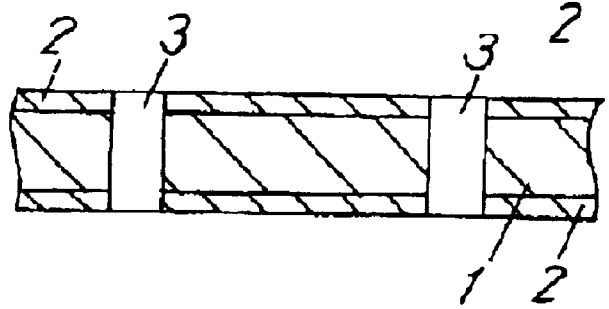

Next, energy beam such as carbon dioxide laser-beam is irradiated onto pre-preg sheet 1 of approx. 150 μm thickness with a laser beam machine as shown in FIG. 4B, so that through holes 3 approx. 200 μm across are formed.

Figure 4C:
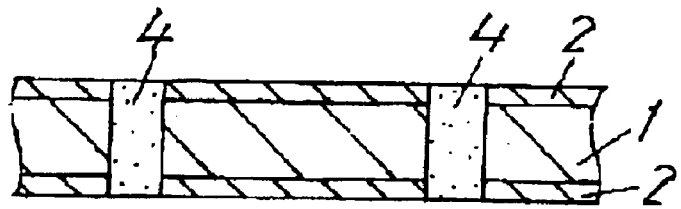
Figure 4D:
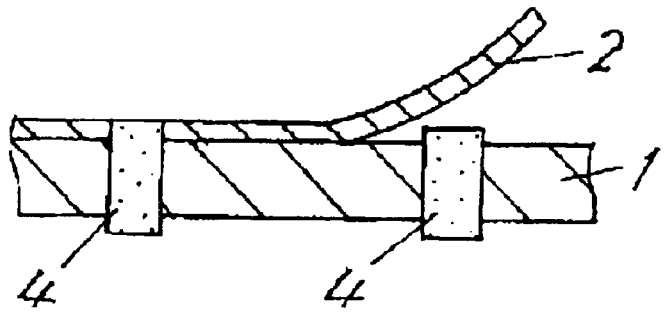

Then, as shown in FIG. 4C, through-holes 3 are filled with conductive paste 4 by a printing method. Conductive paste 4 mainly includes conductive particles and epoxy resin. Then as shown in FIG. 4D, releasing films 2 on upper and lower faces are peeled off.

Figure 4E:
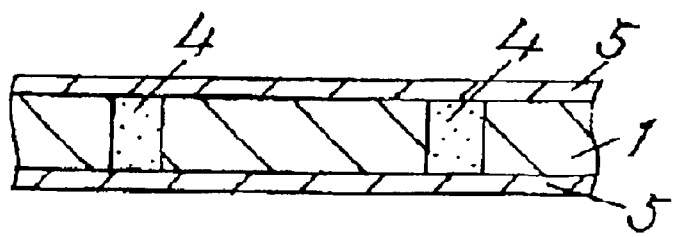
Figure 4F:
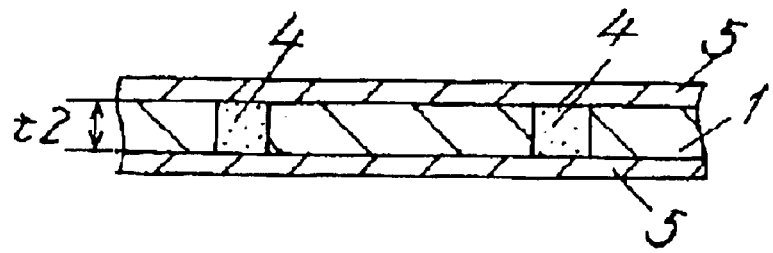
Figure 5A:
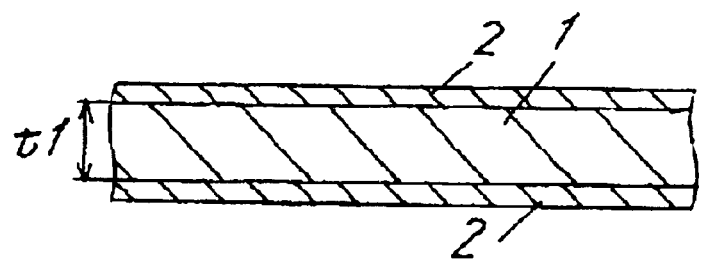
FIG. 5A to FIG. 5F are sectional views illustrating a manufacturing method of conventional clad boards.
Figure 5B:
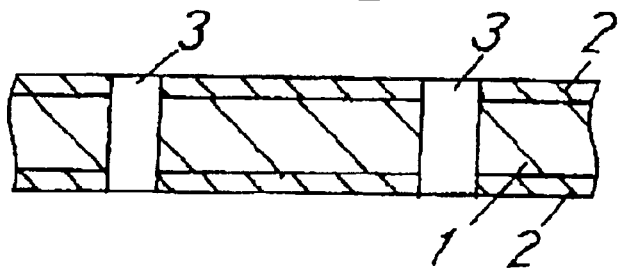
Figure 5C:
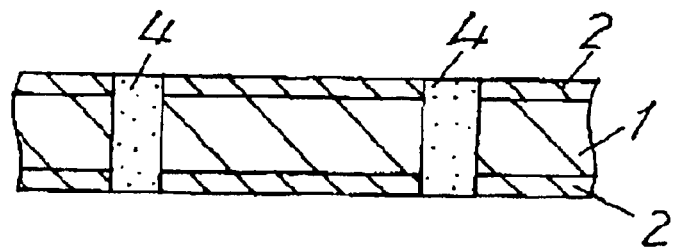
Figure 5D:
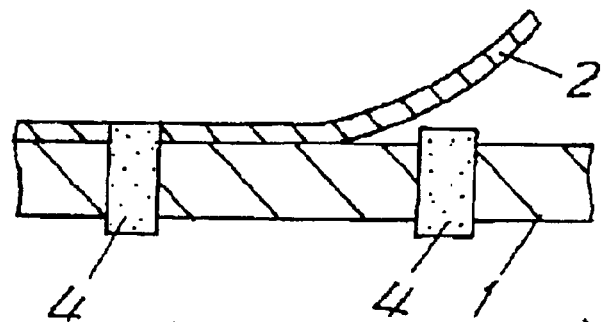
Figure 5E:
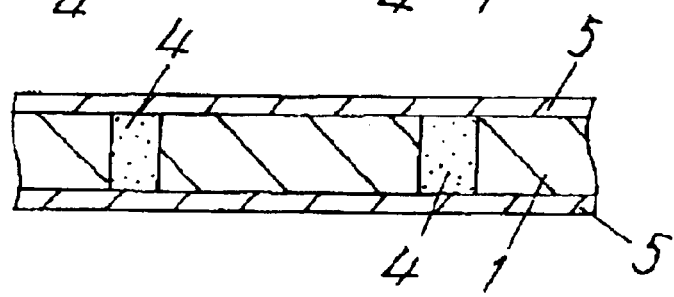
Figure 5F:
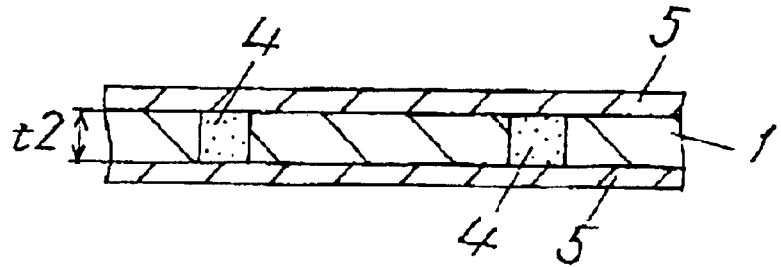

Next, as shown in FIG. 4E, metal foil 5 is placed on both faces of pre-preg sheet 1, then heated and pressed, so that the thickness of sheet 1 is compressed to have from a thickness t1 to a thickness t2 as shown in FIG. 4F. Conductive paste 4 thus connects metal foils 5 on both the faces electrically to each other, and a clad board to be used as a circuit board is obtained.

Then metal foil 5 is selectively etched to form circuit-patterns, and finally, a double-sided circuit-patterned board (not shown) is obtained.

Features of the first embodiment are described hereinafter.

Pre-preg sheet 1, which is to be used in a step of sticking the releasing film, is covered with impregnated resin on its overall surface, so that flat resin layer 8 made of impregnated resin 7 is formed. A thickness of layer 8 ranges from 1 μm to 30 μm, preferably from 5 μm to 20 μm.

If having the thickness exceeding 30 μm, layer 8 is hollowed out and diameters of the through holes become larger than those in non-woven fabric 6 when the sheet is pierced by energy beam such as carbon dioxide laser-beam.

Resin layer 8 may be formed when the resin is impregnated into non-woven fabric 6 by increasing an amount of impregnated resin, increasing a density of the non-woven fabric, or adjusting a condition of impregnating the resin.

Releasing films 2 is disposed as to sandwich pre-preg sheet 1, and sheet 1 and films 2 passes together through a heating roller to be heated and pressed, whereby film 2 is formed on both the faces of sheet 1.

At this time, resin layer 8 made of impregnated resin 7 and formed on sheet 1 is heated, and has a smooth face slightly melted. Then resin layer 8 is securely stuck onto film 2 by pressing without forming gaps.

A critical matter in this step is a smoothness of sheet 1, i.e., resin layer 8. More smoothness of resin layer 8, more solidly are films 2 stuck to layer 8. Therefore, the maximum height difference between peaks and valleys (roughness) on the surface of layer 8 is regulated to not more than 10 μm, and preferably not more than 5 μm. As a result, when through-holes 3 are filled with conductive paste 4, paste 4 remains within holes 3 and never spreads between sheet 1 and film 2. This smoothness thus prevents short circuits between adjacent circuit-patterns formed by etching metal foil 5 selectively.

In the clad board manufactured by this method discussed above, adhesive force between metal foil 5 and resin layer 8 close to the surface of the board increases, and adhesive strength of the circuit patterns to the board accordingly increases.

(Exemplary Embodiment 2)

A manufacturing method in accordance with a second exemplary embodiment is basically the same as that of the first embodiment, and detailed description is thus omitted here. Features only in the second embodiment will be described.

Pre-preg sheet 1 is a composite material formed of thermosetting resin such as epoxy resin (hereinafter called impregnated resin 7) and non-woven fabric 6 of fabric sheet such as aromatic polyamide fiber (aramid fiber). Impregnated resin 7 is not completely cured but includes semi-cured portions, i.e., impregnated resin 7 is in B-stage.

Figure 6A:
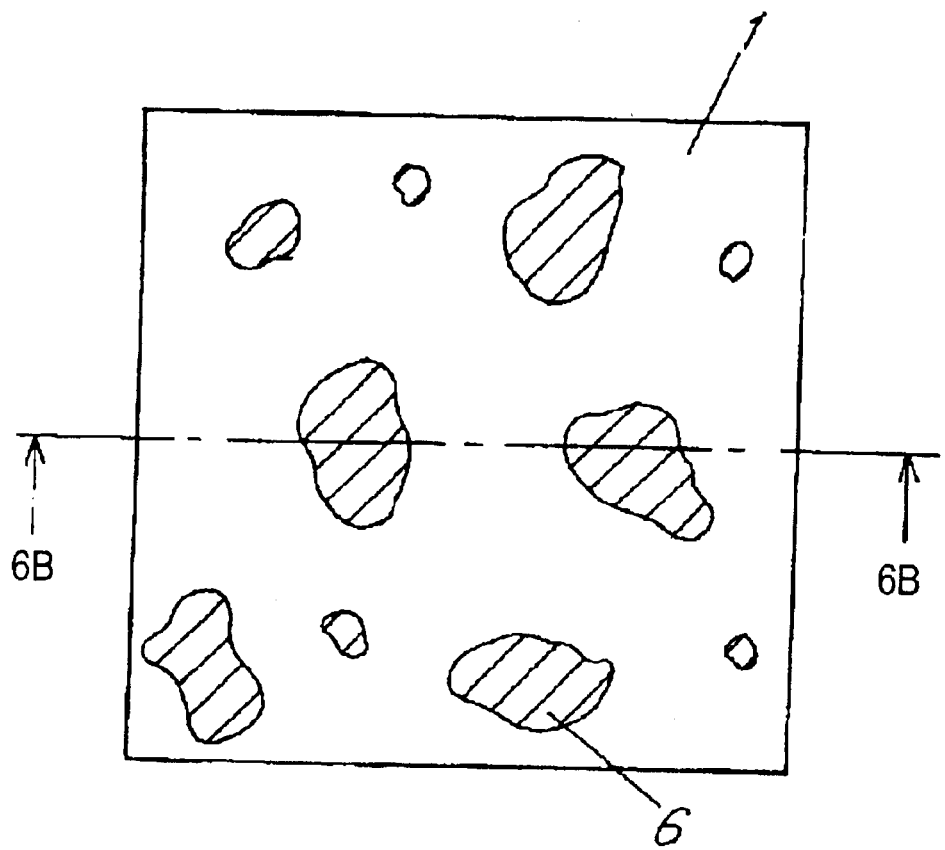
FIG. 6A is a plan view showing a structure of a conventional pre-preg sheet.
Figure 6B:
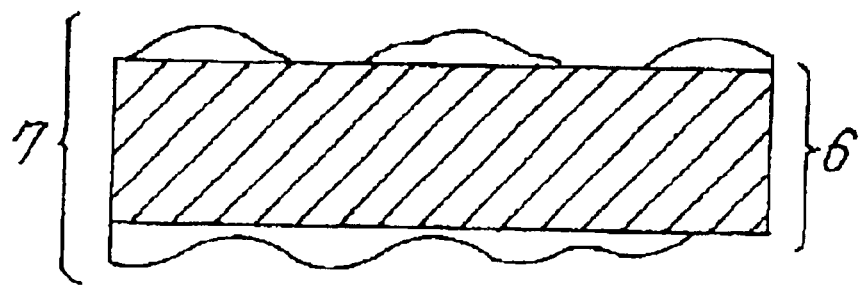
FIG. 6B is a sectional view of the pre-preg sheet taken along line 6B—6B in FIG. 6A.

Aramid fiber non-woven fabric 6 conventionally used for pre-preg sheet 1 has a density ranging from 500 to 700 kg/m$^3$. When resin is impregnated into such non-woven fabric 6, the center section of fabric 6 tends to be impregnated. Therefore, resin is not fully enough impregnated around a surface, and fibers of fabric 6 may be thus exposed on the surface in parts as shown in FIG. 6A and FIG. 6B.

However, aramid fiber non-woven fabric 6 used in the second embodiment has a density ranging from 700 to 1000 kg/m$^3$. When resin is impregnated into such non-woven fabric 6, the center section of fabric 6 is not impregnated well with the resin, and instead, neighborhood of both of the surfaces of fabric 6 are easily impregnated. As a result, smooth surface of resin layer 8 made of impregnated resin 7 is formed on the surfaces.

An important thing here is to form resin layer 8 containing resin of equal amount to resin of the conventional pre-preg sheet 1 without increasing an amount of impregnated resin. The equal amount is 51–54 weight % to the pre-preg sheet.

When conductive paste is compressed to connect layers, either increasing a density of the non-woven fabric or increasing an amount of impregnated resin lowers a compression rate of pre-preg sheet 1. Therefore, both the manners adversely affect the compression of the conductive paste.

However, increasing an amount of the impregnated resin (e.g. not less than 55 weight % of the pre-preg sheet) affects more seriously the lowering of compression rate of pre-preg sheet 1, and not advantageous for a less connecting resistance. Therefore, forming resin layer 8 without increasing an amount of the impregnated resin is extremely advantageous for a less connecting resistance.

A density of aramid fiber non-woven fabric 6 may be controlled by calendering, therefore, the density ranging from 700 to 1000 kg/m$^3$ is obtainable with the same weight of non-woven fabric as the conventional armid fiber non-woven fabric. Not increasing an amount of the impregnated resin is effective for reducing a weight of the clad board.

In a step of sticking releasing films 2 to pre-preg sheet 1, films 2 are disposed on both the faces of sheet 1 such that films 2 sandwich pre-preg sheet 1 discussed above. Then sheet 1 and films 2 passes together through a heating roller to be heated and pressed, so that films 2 solidly adhere to both the faces of sheet 1. Smooth face of layer 8 on both the faces of sheet 1 is slightly melted. Then resin layer 8 is solidly stuck to film 2 by pressing without producing gaps. More smoothness of resin layer 8, more solidly are films 2 stuck to layer 8. Therefore, the maximum height difference between peaks and valleys on the surface of layer 8 is regulated not more than 10 µm, preferably not more than 5 µm.

As a result, when through-holes 3 are filled with conductive paste 4, paste 4 remains within holes 3 and does not spread between sheet 1 and film 2. This smoothness thus prevents short circuits between adjacent circuit-patterns formed by etching selectively metal foil 5.

In the clad board manufactured by the method discussed above, adhesive force between metal foil 5 and resin layer 8 close to the surface of the board increases, and adhesive strength of the circuit patterns to the board accordingly increases.

(Exemplary Embodiment 3)

A manufacturing method in accordance with a third exemplary embodiment is basically the same as that of the first embodiment, and detailed description is thus omitted here. Features only in the third embodiment will be demonstrated.

Figure 2A:
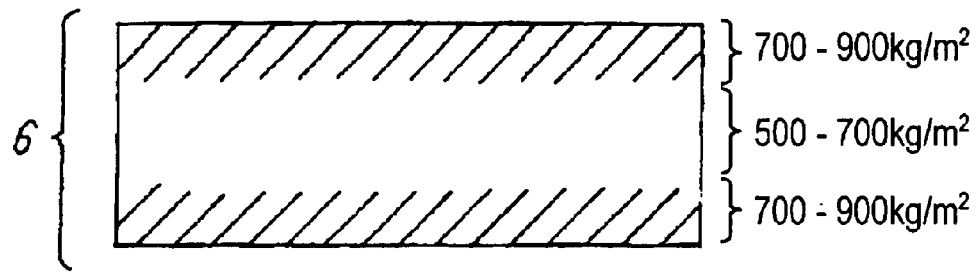
FIG. 2 is a sectional view showing a structure of non-woven fabric in accordance with a third exemplary embodiment of the invention.

Aramid fiber non-woven fabric 6 used in the third embodiment has a density ranging from 700 to 1000 kg/m$^3$ around a surface layer of both the faces of fabric 6 as shown in FIG. 2A. The density of the inside of fabric 6 is lower than that around the surface layer, and preferably ranges from 500 to 700 kg/m$^3$.

If the density becomes lower than 500 kg/m$^3$, a number of air-gaps in pre-preg sheet 1 increases. This makes conductive paste 4 tend to spread from inside of through holes 3 into pre-preg sheet 1 and the lowers its insulating reliability.

In pre-preg sheet 1 having the composition discussed above, resin is not impregnated well in the center section of aramid fiber non-woven fabric 6. Instead, much more resin component is attached around respective surface layers of both the faces of non-woven fabric 6. As a result, smooth resin layer 8 mainly made of impregnated resin 7 is formed on pre-preg sheet 1.

In a step of sticking releasing films 2 to pre-preg sheet 1, films 2 are disposed on both the faces of sheet 1 such that films 2 sandwich such pre-preg sheet 1 discussed above. Then sheet 1 and films 2 passes together through a heating roller to be heated and pressed, so that films 2 solidly adhere to both the faces of sheet 1. Smooth face of layer 8 on both the faces of sheet 1 is slightly melted. Then resin layer 8 is solidly stuck to film 2 by pressing without producing gaps. More smoothness of resin layer 8, more solidly films 2 are stuck to layer 8. Therefore, the maximum height difference between peaks and valleys on the surface of layer 8 is regulated not more than 10 µm, and preferably not more than 5 µm.

As a result, when through-holes 3 are filled with conductive paste 4, paste 4 remains within holes 3 and does not spread between sheet 1 and film 2. This smoothness thus prevents short circuits between adjacent circuit-patterns formed by etching selectively metal foil 5. In the clad board manufactured by this method discussed above, adhesive force between metal foil 5 and resin layer 8 close to the surface of the board increases, and adhesive strength of the circuit patterns to the board accordingly increases.

These advantages are the same as those in the second embodiment. Further, the density at the inside of non-woven fabric 6 is set lower than that around the surface, so that pre-preg sheet 1 can be further compressed in the step of heating and pressing pre-preg sheet 1. As a result, more stable connecting resistance is obtainable.

Figure 2B:
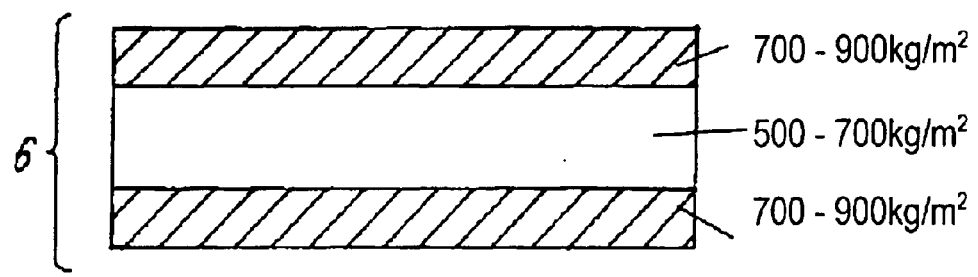

Such a density distribution in aramid fiber non-woven fabric 6 can be also obtained by a multi-layer construction. In other words, two sheets of non-woven fabric having the density ranging from 700 to 1000 kg/m$^3$ are prepared, and at least one sheet of non-woven fabric having a density lower than the previous sheets, preferably ranges from 500 to 700 kg/m$^3$ is prepared. The first two sheets sandwich the second at least one sheet, thereby forming the multi-layer construction as shown in FIG. 2B. This multi-layer construction produces the similar advantages to those discussed above.

In this third embodiment, both the faces of non-woven fabric 6 have the density ranging from 700 to 1000 kg/m$^3$. However, if either one of both the faces has the density of the same range, the similar advantages can be expected.

(Exemplary Embodiment 4)

A manufacturing method of clad boards in accordance with a fourth embodiment is applied to the following cases: Non-woven fabric is exposed on a surface of pre-preg sheet 1 in parts; and Peaks and valleys (roughness) are formed on the surface of a resin layer mainly made of impregnated resin 7, the resin layer being formed on pre-preg sheet 1. In these cases, smooth resin layer 8 made of impregnated resin 7 is formed on both faces of pre-preg sheet 1.

Figure 3:
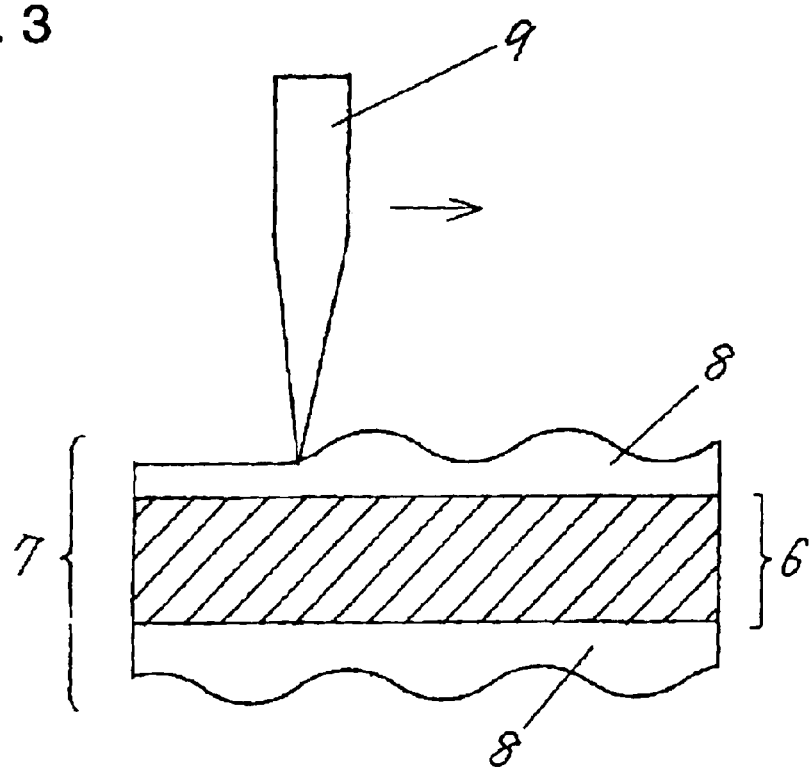
FIG. 3 is a sectional view illustrating a part of manufacturing steps of clad boards in accordance with a fourth exemplary embodiment.

As shown in FIG. 3, sharp blade 9 made of metal plate is applied to the surface of sheet 1, and move relatively to the surface, so that peaks on the surface can be removed, and resin layer 8 on the surface can be shaved into an adequate thickness.

Sheet 1 may be previously heat up to a temperature higher than a melting temperature of impregnated resin 7, or blade 9 may be heated up to a temperature higher than the melting temperature of impregnated resin 7. These manners make the surface resin melted, so that the peaks and valleys on the surface can be smoothed.

Impregnated resin 7 may be squeegeed with blade 9 to supply the impregnated resin to a place where aramid fiber non-woven fabric 6 is exposed or a place where more thickness is required. Thus resin layer 8 having more uniform thickness can be formed on the surface of pre-preg sheet 1. As a result, releasing film 2 can be stuck to the surface of sheet 1 more solidly and stable.

In the fourth embodiment, blade 9 is used as smoothing means; however, another smoothing means shaping in a roll or a plate can produce a similar advantage.

In order to stick film 2 to sheet 1 more positively without gaps, the thickness of resin layer 8 is regulated between 1 and 30 µm, preferably between 5 and 20 µm, and a maximum height difference between the peaks and valleys is preferably regulated not more than 5 µm.

(Exemplary Embodiment 5)

A manufacturing method in accordance with the fifth exemplary embodiment is basically the same as the first embodiment, and detailed description is thus omitted here. Features only in the fifth embodiment will be demonstrated.

Figure 7A:
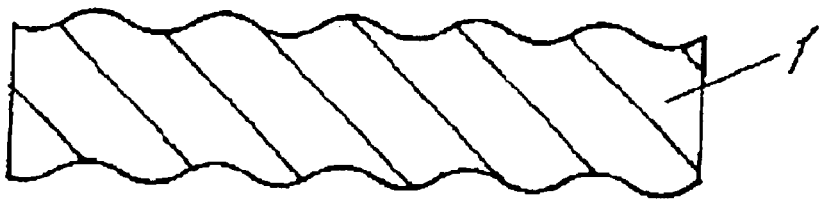
FIG. 7A to FIG. 7C are sectional views illustrating a part of manufacturing steps of conventional clad boards.
Figure 7B:
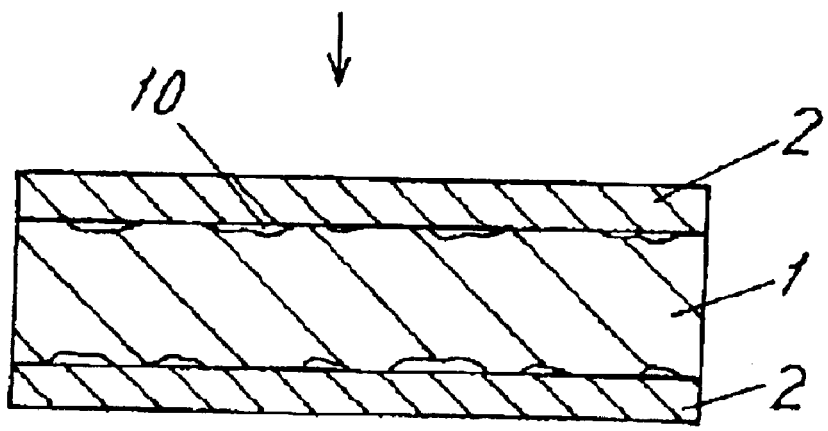
Figure 7C:
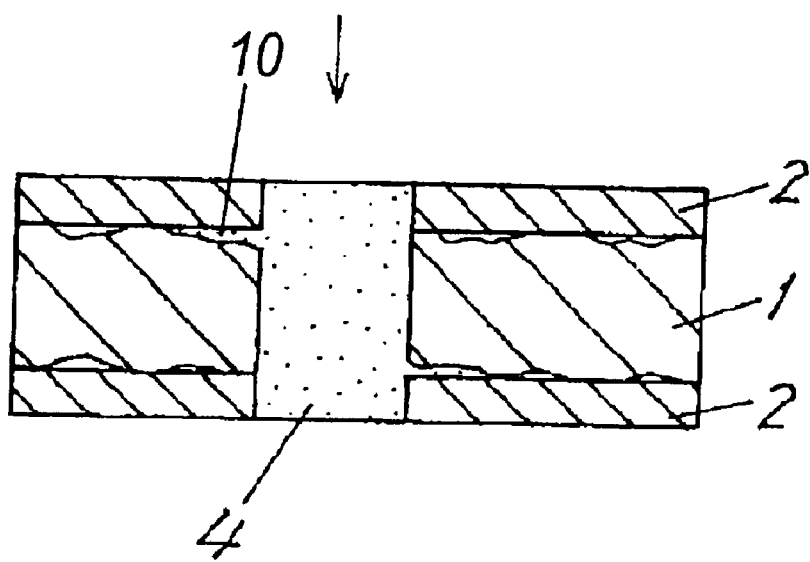

When a surface of pre-preg sheet 1 is not smooth but has peaks and valleys, gaps 10 are produced on interfaces between sheet 1 and releasing films 2 as shown in FIG. 7B. In a step of piercing holes in sheet 1, when energy beam such as carbon dioxide laser-beam is used, vicinity of each one of the holes is subject to heat. Parts of the material forming sheet 1 is deformed, shrunk or sublimated by the heat, thus gaps 10 are produced on the interface between film 2 and sheet 1 around each one of the holes.

Conductive paste used in the fifth embodiment has the following features. A conductive particle of conductive paste 4, e.g., a particle mainly formed of copper powder, has a longest diameter at least greater than a size of gap 10 in a thickness direction. Or, the longest diameter of the particle is at least smaller than a diameter of through-hole 3 in order not to block holes 3 from being filled with paste 4.

Through holes 3 are filled with conductive paste 4 discussed above, so that paste 4 is prevented from spreading into gaps 10 which have been produced in the sticking step or piercing step. This accordingly prevents circuit patterns adjacent to each other from being short-circuited. According to an experiment by the inventors, conductive paste 4 was regulated from spreading into gaps 10 with particles having a diameter not less than 10 $\mu$m.

When holes 3 are filled with conductive paste 4 containing non-spherical particles, fluidity of conductive paste 4 lowers. The spread of the paste into gaps 10 can be thus restrained.

When the non-spherical particles are used in the conductive paste, a number of contact points between each particle increases, so that a stable connecting resistance is obtainable even at a small compression rate. Thus the paste may be used with pre-preg sheet 1 including non-woven fabric at a high density described in embodiments 2 and 3, whereby the paste is prevented from spreading from holes 3 to their outer periphery, and a stable connecting resistance is obtainable.

In order to fill through-holes 3 with conductive paste 4 steadier, a lower viscosity of paste 4 is required. Non-spherical particles may be processed into flat conductive particles from spherical particles (e.g. mechanical force is applied to spherical particles so that the spherical particles are flattened). The flat particles decrease the viscosity of paste 4. This is an alternative effective measure to lower the viscosity since it is undesirable to lower the viscosity by adding solvent to the conductive paste.

In the embodiments 1 through 4 previously discussed, a heating roller is used for sticking releasing film 2 to pre-preg sheet 1. However, the similar advantage can be obtained by other tools, e.g., heating/pressing with two flat boards, and sticking of film 2 to sheet 1 using an adhesive layer stuck to film 2.

In the previous embodiments, through-holes 3 are taken as an example; however, non-through holes opening only one side also produce the similar advantage.

Carbon dioxide laser is used for piercing holes; however, other methods such as gas laser, solid laser including YAG laser, excimer laser, or energy beams other than laser can be used. Further, piercing techniques other than energy beams such as drilling, punching, or plasma etching can be used.

In the present invention, the double-sided clad board is discussed; however, the technique of the present invention can be applied to the multi-layer clad board with the similar advantage.

The PET is used as polymer film employed to releasing film 2; however, other materials, e.g. polyimide (PI), polyethylene-naphthalate (PEN), polyphenylene sulfite (PPS), polypropylene (PP), polyphenylene oxide (PPO) may be used with the similar advantage.

Instead of aramid fiber non-woven fabric 6, aramid fiber woven fabric can be used as fiber sheet. Fibers other than aramid fiber, such as organic fiber material or non-organic fiber material including glass, can be used for forming woven fabric or non-woven fabric. Instead of thermosetting resin, thermoplastic resin can be used.

INDUSTRIAL APPLICABILITY

According to the present invention, a pre-preg sheet having a entire single face or entire double faces smoothed is employed, so that short-circuits and lowering of insulating reliability can be prevented. Both of these problems are caused by gaps produced in an interface between the pre-preg sheet and a releasing film. Therefore, a yield rate can be improved, and quality and reliable circuit boards, in particular, high-density wiring circuit boards can be manufactured.

What is claimed is:

1. A method of manufacturing a clad board for forming circuitry, comprising the steps of:

providing a pre-preg sheet including a fiber sheet and a resin layer on a surface of the fiber sheet, and the resin layer having a smooth surface;

sticking a releasing film on the smooth surface of the resin layer of the pre-preg sheet;

forming a hole in the pre-preg sheet with the releasing film, the hole being one of a non-through-hole and a through-hole;

filling the hole with conductive paste;

peeling off the releasing film; and heating and pressing a metal foil onto the pre-preg sheet.

2. The method of claim 1, wherein:

the fiber sheet is impregnated with resin material containing at least one of thermoplastic resin and thermosetting resin having semi-cured portion; and the resin layer is made of material identical to the resin material.

3. The method of claim 2, further comprising the step of forming the resin layer when the fiber sheet is impregnated with the resin material.

4. The method of claim 2, wherein a thickness of the resin layer ranges from 1 $\mu$m to 30 $\mu$m.

5. The method of claim 1, wherein the fiber sheet has a density ranging from 700 kg/m$^3$ to 1000 kg/m$^3$.

6. A method of manufacturing a dad board for forming circuitry, comprising the steps of;

smoothing a surface of a pre-preg sheet with smoothing means;

sticking a releasing film to the pre-preg sheet;

forming a hole in the pre-preg sheet with the releasing film, the hole being one of a non-through-hole and a through-hole;

filling the hole with conductive paste;

peeling off the releasing film; and heating and pressing a metal foil onto the pre-preg sheet;

wherein the pre-preg sheet includes a fiber sheet impregnated with resin material containing at least one of thermoplastic resin and thermosetting resin having semi-cured portion.

7. A method of manufacturing a clad board for forming circuitry, comprising the steps of:

sticking a releasing film to a pre-preg sheet, so that a gap is produced at an interface between the releasing film and the pre-preg sheet;

forming a hole in the pre-preg sheet with the releasing film, the hole being one of a non-through-hole and a through-hole;

providing a conductive paste containing a conductive particle having a diameter greater than a size of the gap in a thickness direction of the pre-preg sheet;

filling the hole with the conductive paste;

peeling off the releasing film; and heating and pressing a metal foil onto the pre-preg sheet.

8. The method of claim 7, wherein the conductive particle has a non-spherical shape.

9. The method of claim 1, wherein a maximum height difference in roughness at a surface of the pre-preg sheet is not more than 10 $\mu$m.

10. The method of claim 1, wherein the conductive paste includes a conductive particle made by processing a spherical conductive particle into a non-spherical conductive particle.

11. A method of manufacturing a clad board for forming circuitry, comprising the steps of:

sticking a releasing film to a pre-preg sheet;

forming a hole in the pre-preg sheet with the releasing film, the hole being one of a non-through-hole and a through-hole, so that a gap is produced at an interface between the releasing film and the pre-preg sheet;

providing a conductive paste containing a conductive particle having a diameter greater than a size of a gap in a thickness direction of the pre-preg sheet;

filling the hole with the conductive paste;

peeling off the releasing film; and heating and pressing a metal foil onto the pre-preg-preg sheet.

12. The method of claim 7, wherein the conductive particle has a non-spherical shape.

* * * * *

UNITED STATES PATENT AND TRADEMARK OFFICE
CERTIFICATE OF CORRECTION

PATENT NO. : 6,833,042 B2  
APPLICATION NO. : 10/149667  
DATED : December 21, 2004  
INVENTOR(S) : Yamane et al.

It is certified that error appears in the above-identified patent and that said Letters Patent is hereby corrected as shown below:

Title Page, ITEM [56], References Cited, U.S. PATENT DOCUMENTS:  
Insert --5,888,627, 3/1999, Nakatani--

Title Page, ITEM [56], References Cited, FOREIGN PATENT DOCUMENTS:  
Insert --JP 09-321399, 12/1997--

Column 8, line 38, claim 6, after "a" delete "dad", insert --clad--

Column 10, line 9, claim 11, after "the" delete "pre-preg-preg", insert --pre-preg--

Signed and Sealed this

First Day of January, 2008

JON W. DUDAS  
*Director of the United States Patent and Trademark Office*